(12) United States Patent
Kurosawa et al.

(10) Patent No.: US 10,490,531 B2
(45) Date of Patent: Nov. 26, 2019

(54) MANUFACTURING METHOD OF SEMICONDUCTOR DEVICE AND SEMICONDUCTOR DEVICE

(71) Applicant: TOSHIBA MEMORY CORPORATION, Minato-ku (JP)

(72) Inventors: Tetsuya Kurosawa, Yokkaichi (JP); Takanobu Ono, Kuwana (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 41 days.

(21) Appl. No.: 15/912,597

(22) Filed: Mar. 6, 2018

(65) Prior Publication Data

US 2019/0088624 A1  Mar. 21, 2019

(30) Foreign Application Priority Data

Sep. 20, 2017 (JP) .................. 2017-180375

(51) Int. Cl.
*H01L 25/065* (2006.01)
*H01L 23/13* (2006.01)
(Continued)

(52) U.S. Cl.
CPC .......... *H01L 25/0657* (2013.01); *H01L 23/13* (2013.01); *H01L 24/29* (2013.01); *H01L 24/48* (2013.01); *H01L 24/73* (2013.01); *H01L 24/83* (2013.01); *H01L 25/0652* (2013.01); *H01L 25/50* (2013.01); *H01L 23/3128* (2013.01); *H01L 2224/45144* (2013.01);
(Continued)

(58) Field of Classification Search
CPC ..... H01L 23/13; H01L 23/3128; H01L 24/29; H01L 24/48; H01L 24/73; H01L 24/83; H01L 25/0652; H01L 25/0657; H01L 25/50
See application file for complete search history.

(56) References Cited

U.S. PATENT DOCUMENTS 7,371,612 B2   5/2008   Ball
7,582,953 B2   9/2009   Lin
(Continued)

FOREIGN PATENT DOCUMENTS

JP   2002-246539   8/2002
JP   2010-50480    3/2010
(Continued)

*Primary Examiner* — Joseph M Galvin, III
(74) *Attorney, Agent, or Firm* — Oblon, McClelland, Maier & Neustadt, L.L.P.

(57) ABSTRACT

A manufacturing method of a semiconductor device according to the present embodiment includes forming a modified layer with distortion in semiconductor crystals in a first and a second semiconductor wafers by radiating laser to a dicing region of the first and second semiconductor wafers, each of the first and second semiconductor wafers including a plurality of semiconductor chips. The method also includes stacking the second semiconductor wafer on the first semiconductor wafer to be shifted in a first direction. The first direction is a direction from a first side of a first semiconductor chip of the first semiconductor wafer towards an opposite side to the first side of the first semiconductor chip. The method further includes cleaving the first and second semiconductor wafers.

11 Claims, 8 Drawing Sheets

(51) Int. Cl.
   *H01L 23/00*   (2006.01)
   *H01L 25/00*   (2006.01)
   *H01L 23/31*   (2006.01)

(52) U.S. Cl.
   CPC .............. *H01L 2224/73265* (2013.01); *H01L 2224/92247* (2013.01); *H01L 2225/0651* (2013.01); *H01L 2225/06506* (2013.01); *H01L 2225/06562* (2013.01); *H01L 2924/15311* (2013.01)

(56) References Cited

U.S. PATENT DOCUMENTS

| | | | |
|---|---|---|---|
| 8,253,232 B2 | 8/2012 | Kim et al. | |
| 8,399,974 B1 | 3/2013 | Huneke | |
| 8,557,635 B2 | 10/2013 | Omizo et al. | |
| 8,796,076 B2 | 8/2014 | Yoshimura et al. | |
| 2006/0226520 A1* | 10/2006 | Yoshimura | H01L 21/6835 257/666 |
| 2012/0223441 A1* | 9/2012 | Omizo | H01L 24/83 257/777 |
| 2017/0092554 A1* | 3/2017 | Abe | H01L 21/67092 |

FOREIGN PATENT DOCUMENTS

| | | |
|---|---|---|
| JP | 4428189 | 3/2010 |
| JP | 5289484 | 9/2013 |
| JP | 5537515 | 7/2014 |
| JP | 2015-191961 | 11/2015 |
| JP | 2016-4835 | 1/2016 |
| TW | I306658 B | 2/2009 |
| TW | 201044548 A1 | 12/2010 |
| TW | I455280 B | 10/2014 |

\* cited by examiner

MANUFACTURING METHOD OF SEMICONDUCTOR DEVICE AND SEMICONDUCTOR DEVICE

CROSS REFERENCE TO RELATED APPLICATIONS

This application is based upon and claims the benefit of priority from the prior Japanese Patent Application No. 2017-180375, filed on Sep. 20, 2017, the entire contents of which are incorporated herein by reference.

FIELD

The embodiments of the present invention relate to a manufacturing method of a semiconductor device and a semiconductor device.

BACKGROUND

A semiconductor wafer is separated into semiconductor chips by dicing and is then placed on a frame or a mounting board in the form of a semiconductor chip in a die bonding process. In some cases, a plurality of semiconductor chips are stacked on the mounting board to achieve a large-capacity or high-performance semiconductor device. In a case of stacking the semiconductor chips, each semiconductor chip is aligned with another semiconductor chip directly below or the mounting board and is then bonded to the another semiconductor chip or the mounting board. Therefore, a process of stacking the semiconductor chips requires a long time and it is likely that foreign matters enter between the semiconductor chips.

DETAILED DESCRIPTION

Embodiments will now be explained with reference to the accompanying drawings. The present invention is not limited to the embodiments. In the embodiments, "an upper direction" or "a lower direction" refers to a relative direction when a direction of a surface of a semiconductor substrate on which semiconductor elements are provided or a direction of a back-side surface of the semiconductor substrate is assumed as "an upper direction". Therefore, the term "upper direction" or "lower direction" occasionally differs from an upper direction or a lower direction based on a gravitational acceleration direction.

A manufacturing method of a semiconductor device according to the present embodiment includes forming a modified layer with distortion in semiconductor crystals in a first and a second semiconductor wafers by radiating laser to a dicing region of the first and second semiconductor wafers, each of the first and second semiconductor wafers including a plurality of semiconductor chips. The method also includes stacking the second semiconductor wafer on the first semiconductor wafer to be shifted in a first direction. The first direction is a direction from a first side of a first semiconductor chip of the first semiconductor wafer towards an opposite side to the first side of the first semiconductor chip. The method further includes cleaving the first and second semiconductor wafers.

First Embodiment

FIGS. 1A to 10 are schematic diagrams illustrating an example of a manufacturing method of a semiconductor device according to a first embodiment. In the semiconductor device according to the present embodiment, a modified layer is formed inside silicon on a dicing line of each of a plurality of semiconductor wafers by laser dicing. Thereafter, the semiconductor wafers are stacked in a wafer state, are expanded on a resin tape, and are separated into semiconductor chips while being stacked. The semiconductor chips are mounted on a mounting board while being stacked. For example, the semiconductor device can be a semiconductor memory such as a NAND EEPROM (Electrically Erasable Programmable Read-Only Memory). However, the semiconductor device is not limited thereto. The semiconductor device can be any semiconductor device configured by stacking a plurality of semiconductor chips having the same configuration.

Figure 1A:
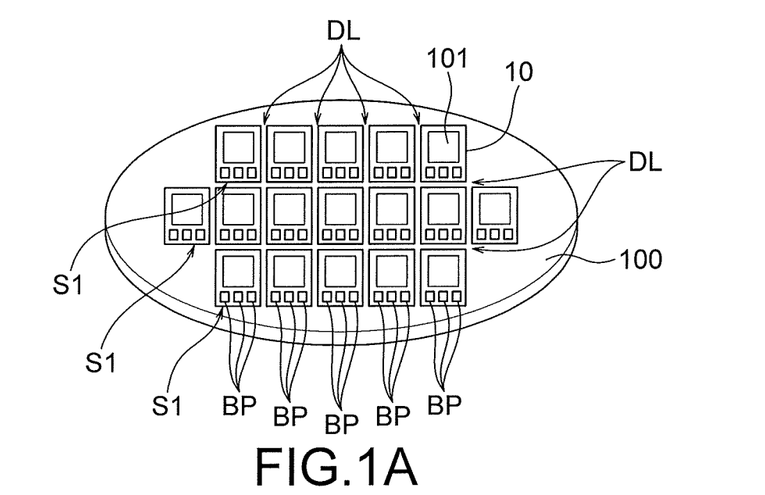
FIGS. 1A and 1B are diagrams illustrating an example of a manufacturing method of a semiconductor device according to a first embodiment.

First, as illustrated in FIG. 1A, semiconductor elements 101 are formed on a first semiconductor wafer 100. The semiconductor element 101 is formed for each semiconductor chip (first semiconductor chip) 10. There is a dicing line DL between the semiconductor chips 10. The semiconductor chips 10 are separated from each other by performing cutting along this dicing line DL later. The semiconductor chips 10 have substantially the same patterns and have semiconductor integrated circuits that are substantially the same in the configuration, respectively.

Bonding pads BP are formed on a front surface of each of the semiconductor chips 10 of the first semiconductor wafer 100. For example, conductive metal such as Cu, Al, Ag, or Au is used for the bonding pads BP. The bonding pads BP are provided near a first side S1 of each semiconductor chip 10 and are arranged along the first side S1.

Figure 1B:
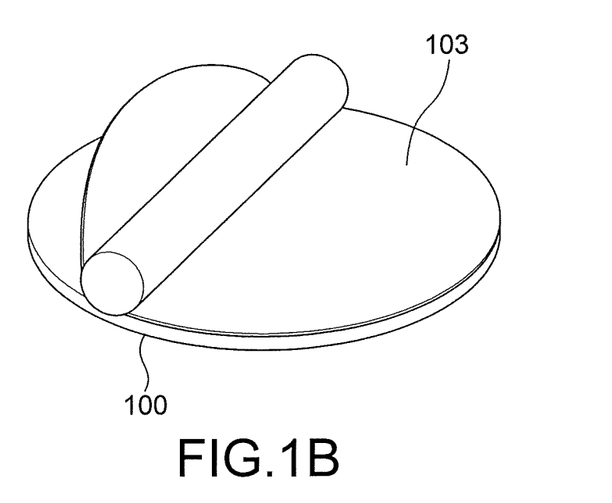

Subsequently, a plasma treatment is performed for cleaning a front surface of the first semiconductor wafer 100. Thereafter, a protective tape 103 is bonded to the front surface of the first semiconductor wafer 100, as illustrated in FIG. 1B. A photosensitive adhesive (110 in FIG. 6) is provided as a protective film and an adhesive on the first semiconductor wafer 100. The photosensitive adhesive is a protective material, such as photosensitive polyimide, that can be processed by lithography and is caused to have adhesiveness by being heated. An applied region of the photosensitive adhesive will be described later with reference to FIG. 6.

Figure 2:
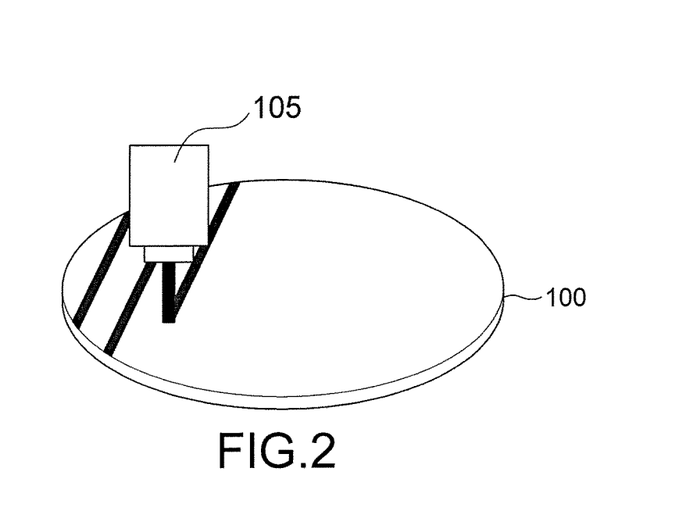
FIG. 2 is a diagram illustrating an example of the manufacturing method of a semiconductor device following FIG. 1.
Figure 3:
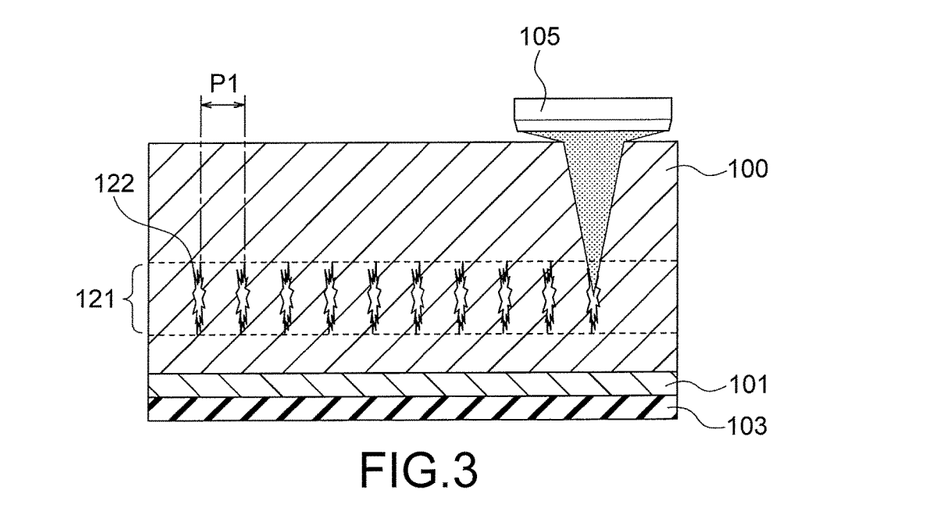
FIG. 3 is a cross-sectional view of a portion along a dicing line in FIG. 2.

Subsequently, laser is radiated to a portion of a reverse surface of the first semiconductor wafer 100, which corresponds to a dicing line (a dicing region), using a laser oscillator 105, as illustrated in FIG. 2. By this radiation, a modified layer (an amorphous silicon layer or a polysilicon layer) 121 is formed inside the first semiconductor wafer 100 (inside a silicon substrate), as illustrated in FIG. 3. FIG. 3 is a cross-sectional view of a portion along the dicing line in FIG. 2. The laser oscillator 105 causes laser to focus on an arbitrary depth position in the silicon substrate. The laser preferably has a wavelength not shorter than 800 nm and not longer than 3000 nm to enable single crystal silicon to be modified. With a wavelength shorter than 800 nm, a probability that the laser is absorbed in silicon is increased, so that it is difficult to form the modified layer. With a wavelength longer than 3000 nm, a probability that the laser is transmitted through silicon is increased, so that it is difficult to form the modified layer. By radiating this laser to the silicon substrate, single crystal silicon is heated at the focus position of the laser to be modified to amorphous silicon or polysilicon.

The laser is radiated with a certain pitch P1. Therefore, modified portions 122 are formed with the certain pitch P1 in the modified layer 121. The modified layer 121 has distortion with respect to semiconductor crystals (for example, single crystal silicon) in its surroundings in the semiconductor wafer. Therefore, cleavage regions (not illustrated) are generated in the surroundings of the modified layer 121. If the pitch P1 is narrow, the cleavage regions in the surroundings of the modified portion 122 are connected to each other, resulting in the modified layer 121 that is layer-shaped (strip-shaped).

Figure 4:
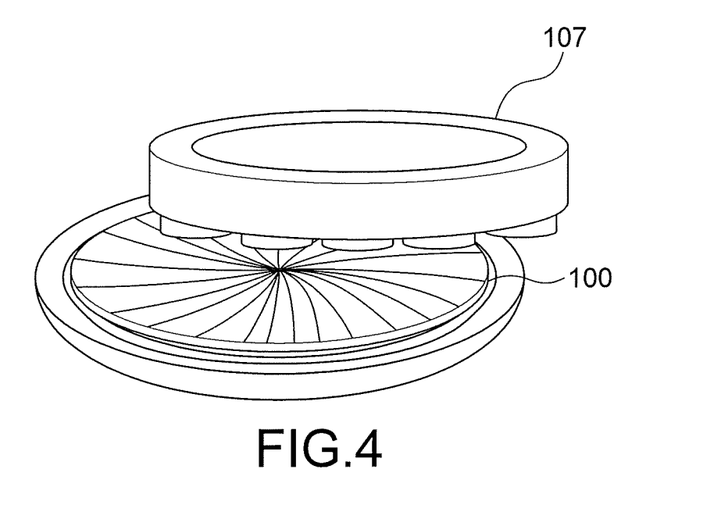
FIG. 4 is a diagram illustrating an example of the manufacturing method of a semiconductor device following FIG. 2.

Subsequently, the silicon substrate is ground from the reverse surface of the first semiconductor wafer 100 by a grinding stone 107, as illustrated in FIG. 4. In this process, the first semiconductor wafer 100 is ground to a position shallower than the modified layer 121 in FIG. 3, to leave the modified layer 121 in the first semiconductor wafer 100. In this manner, the first semiconductor wafer 100 is formed as a thin film.

Second to n-th semiconductor wafers (n is an integer equal to or more than 2) are also formed in an identical manner to the first semiconductor wafer 100. The second to n-th semiconductor wafers have substantially the same configurations as the first semiconductor wafer 100 and include substantially the same semiconductor chips. Also in each of the second to n-th semiconductor wafers, a modified layer is formed on a dicing line as in the first semiconductor wafer 100. In the following descriptions, the first to n-th semiconductor wafers are denoted by 100_1 to 100_n, respectively.

Figure 5:
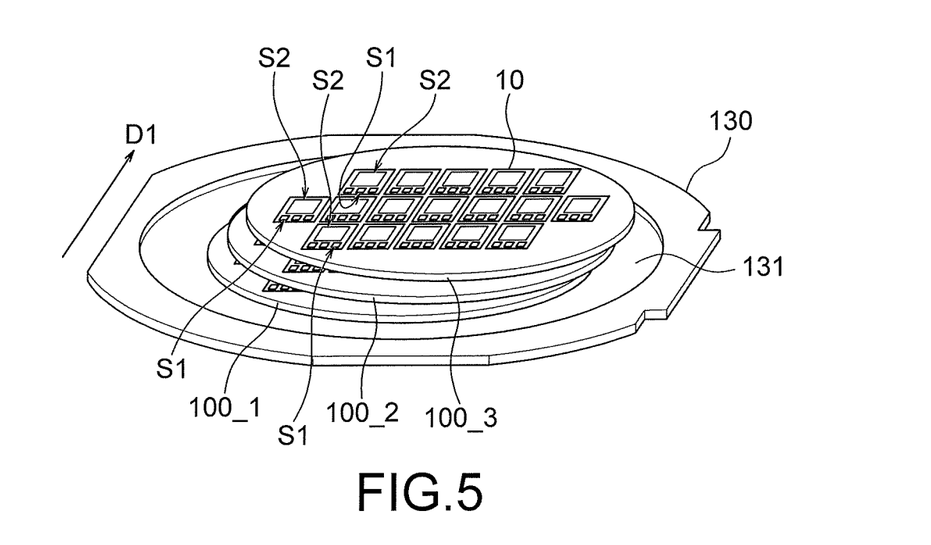
FIG. 5 is a diagram illustrating an example of the manufacturing method of a semiconductor device following FIG. 4.

Subsequently, the reverse surface of the first semiconductor wafer 100_1 is attached to a flexible adhesive tape 131 placed in a wafer ring 130, as illustrated in FIG. 5. The second semiconductor wafer 100_2 is stacked on the first semiconductor wafer 100_1, and the third semiconductor wafer 100_3 is stacked on the second semiconductor wafer 100_2. The fourth to n-th semiconductor wafers (not illustrated) can be also stacked in an identical manner.

The second semiconductor wafer 100_2 is stacked to be shifted from the first side S1 of each of the semiconductor chips 10 of the first semiconductor wafer 100_1 in a first direction D1 towards a side S2 opposite to the first side S1.

Figure 6:
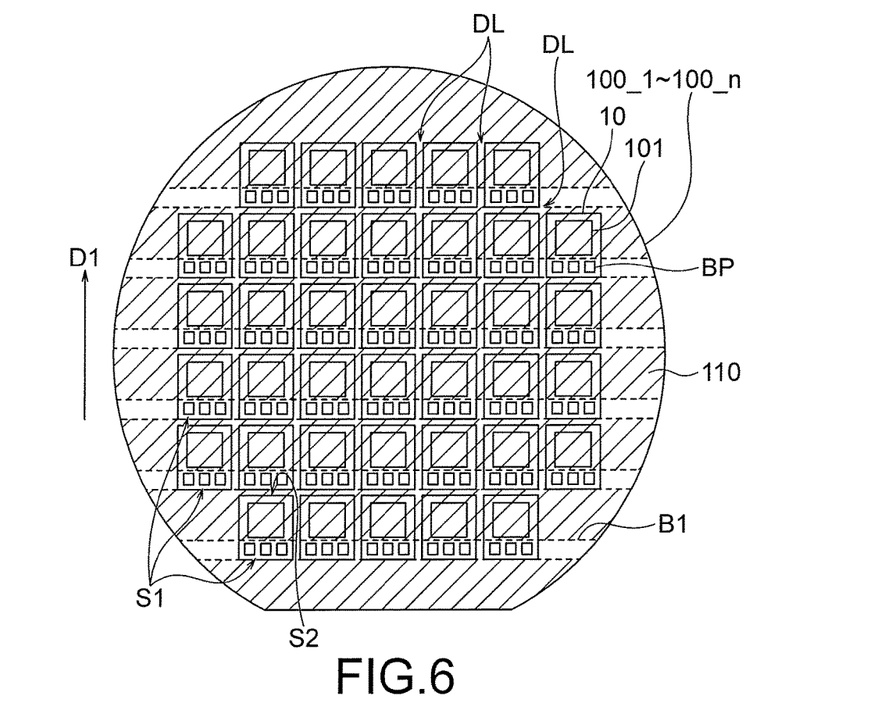
FIG. 6 is a plan view illustrating a configuration example of a first semiconductor wafer.

For example, FIG. 6 is a plan view illustrating a configuration example of the first semiconductor wafer 100_1. The configurations of the second to n-th semiconductor wafers 100_2 to 100_n can be identical to the configuration of the first semiconductor wafer 100_1. Accordingly, the configuration of the first semiconductor wafer 100_1 is described here and descriptions of the configurations of the second to n-th semiconductor wafers 100_2 to 100_n are omitted.

The first semiconductor wafer 100_1 has the semiconductor chips 10. The dicing line DL is provided between the semiconductor chips 10. Although not illustrated in FIG. 6, a modified layer is formed on the dicing line DL. A semiconductor element 101 is provided in each of the semiconductor chips 10. The bonding pads BP are arranged near the first side S1 of each first semiconductor chip 10 along the first side S1.

On the front surface of each semiconductor chip 10, the photosensitive adhesive 110 as a first adhesive covers a region from the side S2 to a first boundary B1 in front of the bonding pads BP. The photosensitive adhesive 110 does not cover a region of the bonding pads BP from the first boundary B1 to the first side S1.

The photosensitive adhesive 110 is applied on the first semiconductor wafer 100_1 before the process illustrated in FIG. 1A, and is patterned by lithography to cover the region from the side S2 opposite to the first side S1 of each semiconductor chip 10 to the first boundary B1 in front of the bonding pads BP and not to cover the region from the first boundary B1 to the first side S1.

Figure 7:
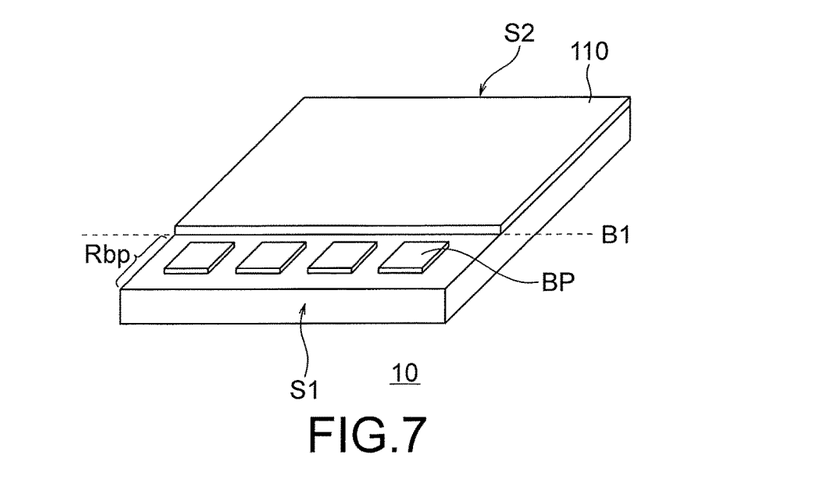
FIG. 7 is a perspective view illustrating one extracted semiconductor chip.

FIG. 7 is a perspective view illustrating one extracted semiconductor chip 10. With reference to FIG. 7, it is found that the photosensitive adhesive 110 covers the region from the side S2 to the first boundary B1 in front of the bonding pads BP and exposes the region of the bonding pads BP from the first boundary B1 to the first side S1.

Figure 8:
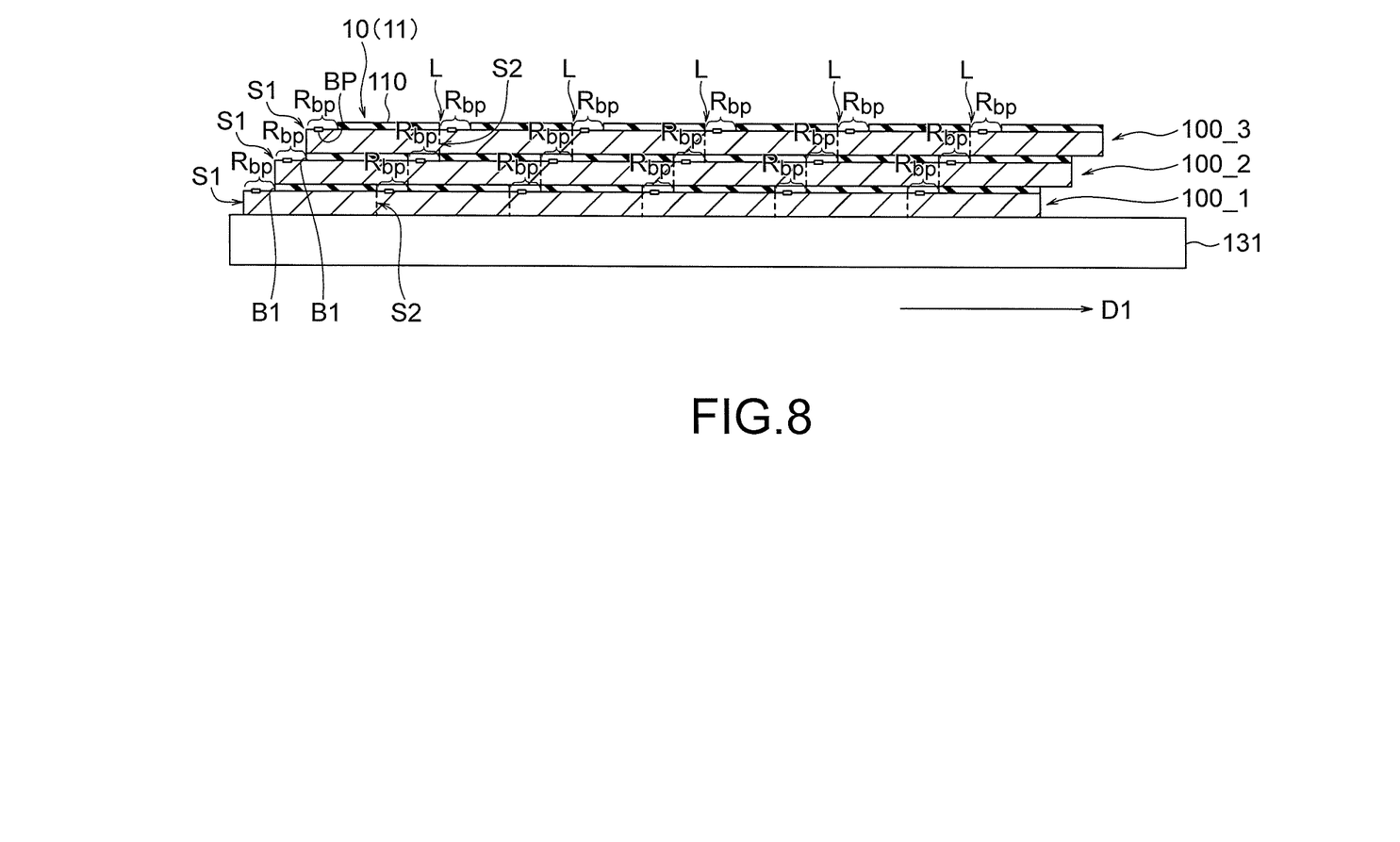
FIG. 8 is a cross-sectional view taken along a direction D1 in FIG. 5.

FIG. 8 is a cross-sectional view taken along the first direction D1 in FIG. 5. The first to third semiconductor wafers 100_1 to 100_3 are stacked on the resin tape 131. The second semiconductor wafer 100_2 is shifted from the first side S1 of each of the semiconductor chips 10 of the first semiconductor wafer 100_1 to the first boundary B1. The third semiconductor wafer 100_3 is shifted from the first side S1 of each of the semiconductor chips 10 of the second semiconductor wafer 100_2 to the first boundary B1. In the following descriptions, the shifting width from the first side S1 to the first boundary B1 is also referred to as "region Rbp of the bonding pads BP".

As shown in FIG. 8, a side S1 of the semiconductor chip (a second semiconductor chip) of the second semiconductor wafer 100_2 is shifted from the side (first side) S1 of the first semiconductor chip 100_1 to the first boundary B1 of the first semiconductor chip 100_1.

The number of the stacked semiconductor wafers is not limited. Therefore, the third to n-th semiconductor wafers (n is 3 or more) having substantially the same configurations as the first and second semiconductor wafers can be stacked on the second semiconductor wafer. In this case, the second to n-th semiconductor wafers 100_2 to 100_n are stacked to be shifted in the first direction D1 with respect to respective semiconductor wafers directly below. The shifting width is equal to the width from the first side S1 to the first boundary B1 (the width of the region Rbp of the bonding pads BP).

When the first to n-th semiconductor wafers 100_1 to 100_n are stacked, the stacked first to n-th semiconductor wafers 100_1 to 100_n can be pressed only once by a certain pressure. Due to this pressing, the first to n-th semiconductor wafers 100_1 to 100_n are pressure-welded. Alternatively, the stacked first to n-th semiconductor wafers 100_1 to 100_n can be pressed by a first pressure and thereafter pressed by a second pressure higher than the first pressure. That is, the stacked first to n-th semiconductor wafers 100_1 to 100_n can be pressed multiple times by different pressures. In this case, after pressing by the first pressure, pressing by the second pressure can be performed using a different compression device.

Subsequently, the stacked first to n-th semiconductor wafers 100_1 to 100_n are pressed while being heated, thereby causing reflow of the photosensitive adhesive 110. In this manner, the first to n-th semiconductor wafers 100_1 to 100_n are caused to adhere to each other.

Figure 9:
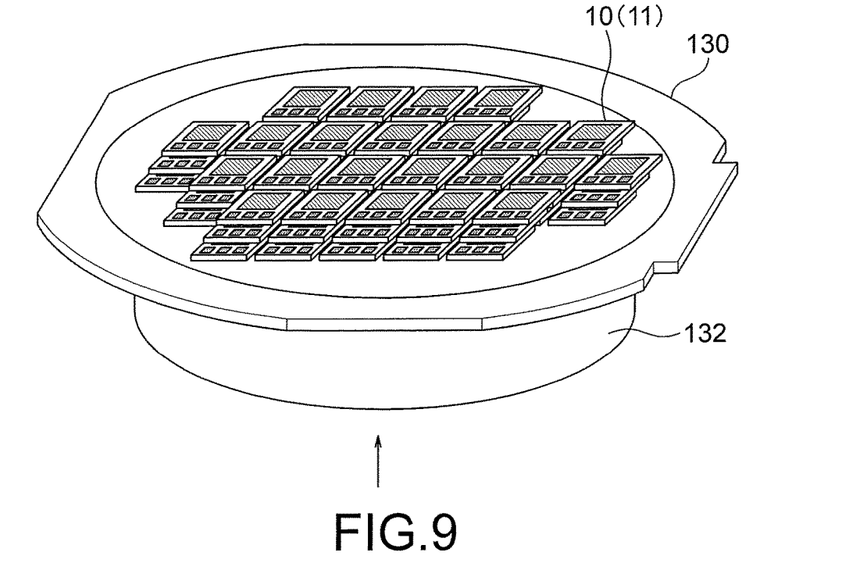
FIG. 9 is a diagram illustrating an example of the manufacturing method of a semiconductor device following FIG. 5.

Subsequently, the resin tape 131 is pushed up by a push-up member 132 from below, as illustrated in FIG. 9, to stretch (expand) the resin tape 131. Therefore, the first to third semiconductor wafers 100_1 to 100_3 are stretched along with the resin tape 131. In this process, the first to third semiconductor wafers 100_1 to 100_3 are each cleaved along the modified layer (illustrated with a broken line L in FIG. 8), and are separated into stacked semiconductor chips 10. In the following descriptions, the stacked semiconductor chips 10 are also referred to as "a stacked body 11".

Figure 10:
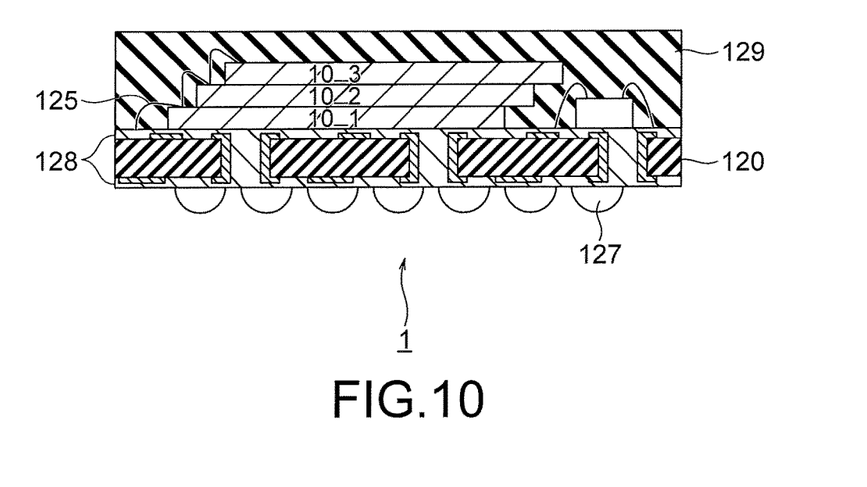
FIG. 10 is a diagram illustrating an example of the manufacturing method of a semiconductor device following FIG. 9.

Subsequently, the stacked body 11 is mounted (die-bonded) onto a mounting board 120, as illustrated in FIG. 10. In this process, adhesiveness of the resin tape 131 is lowered by radiation of UV light to the resin tape 131. The bonding pads BP provided on the semiconductor chips 10 are bonded to the mounting board 120 with wires 125. Further, the semiconductor chip 10 and the wires 125 are sealed with a resin 129. In this manner, a semiconductor device 1 according to the present embodiment is completed.

According to the present embodiment, the modified layer 121 is formed on the dicing line DL of each of the semiconductor wafers 100_1 and 100_2 by laser, and thereafter the semiconductor wafers 100_1 and 100_2 are stacked to be shifted from each other by the region of the bonding pads BP. The stacked semiconductor wafers 100_1 and 100_2 are then cleaved simultaneously. That is, in the present embodiment, instead that semiconductor chips are stacked after each semiconductor wafer is separated into the semiconductor chips, the semiconductor wafers are stacked before cleavage and are then cleaved in a lump in a stacked state.

If the semiconductor chips are stacked after each semiconductor wafer is separated into the semiconductor chips, it is necessary to align the semiconductor chips one by one when the semiconductor chips are mounted on a mounting board. Therefore, stacking of the semiconductor chips requires a long time, lowering the productivity. Also, when a semiconductor chip is stacked on another semiconductor chip, it is highly likely that foreign matters, such as dust or particles, enter between those semiconductor chips.

In contrast thereto, according to the manufacturing method of the present embodiment, the semiconductor wafers are stacked in a wafer state. Therefore, it is unnecessary to align the semiconductor chips one by one, and it is possible to largely reduce the number of times of alignment in stacking. This reduction results in reduction of a stacking time of the semiconductor chips. In addition, the number of cleavages of the semiconductor wafers is reduced, and therefore particles generated during cleavage are also reduced. Further, because the semiconductor chips (that is, the stacked body 11) are mounted on the mounting board 120 in a stacked state, it is less likely that foreign matters enter between one semiconductor chip and another semiconductor chip. This improves the yield of the semiconductor device 1.

Further, the semiconductor wafers are aligned with each other in a wafer state and alignment of the semiconductor chips one by one is not performed. Therefore, positions of the stacked semiconductor chips are stable in a semiconductor package, and a variation in the positions of these semiconductor chips is reduced. When the variation in the positions of the semiconductor chips in the stacked body 11 is reduced, it is possible to reduce a margin that takes the variation into consideration. Therefore, it is possible to substantially reduce the shifting width of the semiconductor chips 10 in the stacked body 11, resulting in reduction of the package size of the semiconductor device 1.

According to the present embodiment, the photosensitive adhesive 110 covers the region from the side S2 to the first boundary B1 in front of the bonding pads BP on the front surface of each of the semiconductor chips 10 included in each of the semiconductor wafers 100_1 to 100_n, without covering the region from the first boundary B1 to the first side S1, as illustrated in FIG. 7. Also, the stacked semiconductor wafers 100_2 to 100_n are stacked to be shifted with respect to the corresponding semiconductor wafers 100_1 to 100_n−1 directly below from the first boundary B1 to the first side S1, respectively, as illustrated in FIG. 8. That is, the photosensitive adhesive 110 is not provided in the region of the bonding pads BP. The photosensitive adhesive 110 of each semiconductor chip 10 is almost not in contact with the reverse surface of another semiconductor chip 10 located above the bonding pads BP. Therefore, it is possible to easily cleave the stacked semiconductor wafers 100_1 to 100_n, and mutually adjacent stacked bodies 11 can be easily separated from each other without adhering to each other after cleavage.

(Semiconductor Device)

Figure 11:
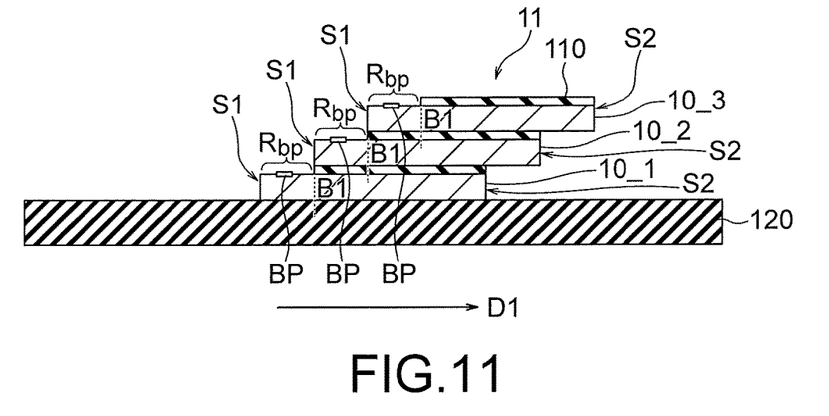
FIG. 11 is a cross-sectional view illustrating a configuration example of a stacked body.

The configuration of the semiconductor device 1 according to the present embodiment is described next with reference to FIGS. 10 and 11. FIG. 10 is a cross-sectional view illustrating a configuration example of the semiconductor device 1 according to the first embodiment. FIG. 11 is a cross-sectional view illustrating a configuration example of the stacked body 11.

The semiconductor device 1 according to the present embodiment includes the mounting board 120, the first to third semiconductor chips 10_1 to 10_3, the photosensitive adhesive 110, the bonding wires 125, and the resin 129.

The mounting board 120 has a wiring layer 128 on a front surface and a reverse surface. The stacked first to third semiconductor chips 10_1 to 10_3 (the stacked body 11) are provided on the front surface of the mounting board 120. Bumps 127 are provided on the reverse surface of the mounting board 120. The mounting board 120 includes an insulator, such as glass epoxy resin, as a base and is provided with the wiring layer 128 on a front surface and a reverse surface of the base, for example. Conductive metal, such as copper, is used for the wiring layer 128, for example.

The first to third semiconductor chips 10_1 to 10_3 are provided on the mounting board 120 and each include the bonding pads BP that are arranged along the first side S1 of the front surface. Each of the first to third semiconductor chips 10_1 to 10_3 has the configuration as described with reference to FIGS. 1 and 7. Therefore, the bonding pads BP are arranged near the first side S1 of each of the first to third semiconductor chips 10_1 to 10_3 along the first side S1. The photosensitive adhesive 110 covers the region from the side S2 to the first boundary B1 in front of the bonding pads BP and does not cover the region of the bonding pads BP from the first boundary B1 to the first side S1.

The second semiconductor chip 10_2 is stacked to be shifted from the first side S1 of the first semiconductor chip 10_1 in the first direction D1 towards the first boundary B1. The shifting width of the second semiconductor chip 10_2 with respect to the first semiconductor chip 10_1 is substantially equal to the width of the region Rbp of the bonding pads BP from the first boundary B1 to the first side S1 of the first semiconductor chip 10_1. The photosensitive adhesive 110 (second adhesive) between the second semiconductor chip 10_2 and the third semiconductor chip 10_3 covers the region from the side S2 to the first boundary B1 in front of the bonding pads BP in the second semiconductor chip 10_2 and does not cover the region Rbp of the bonding pads BP from the first boundary B1 to the first side S1.

The third semiconductor chip 10_3 is also stacked to be shifted with respect to the second semiconductor chip 10_2 in the first direction D1. The shifting width of the third semiconductor chip 10_3 with respect to the second semiconductor chip 10_2 is also substantially equal to the width of the region Rbp of the bonding pads BP from the first boundary B1 to the first side S1 of the second semiconductor chip 10_2. The photosensitive adhesive 110 on the third semiconductor chip 10_3 also covers the region from the side S2 to the first boundary B1 in front of the bonding pads BP in the third semiconductor chip 10_3 and does not cover the region Rbp of the bonding pads BP from the first boundary B1 to the first side S1.

The bonding wires 125 are connected between the bonding pads BP and the wiring layer 128 on the mounting board 120. The bonding pads BP are electrically connected to the wiring layer 128 or the bumps 127 via the bonding wires 125. For example, conductive metal, such as gold, is used for the bonding wires 125.

The resin 129 covers and protects the first to third semiconductor chips 10_1 to 10_3 and the bonding wires 125.

In FIGS. 10 and 11, the first to third semiconductor chips 10_1 to 10_3 are illustrated. However, the number of the stacked semiconductor chips is not limited to three. Therefore, the semiconductor chips 10_1 to 10_n (n is an integer equal to or more than 2) can be stacked.

According to the present embodiment, the photosensitive adhesive 110 covers the region from the side S2 to the first boundary B1 in front of the bonding pads BP on the front surface of each of the semiconductor chips 10_1 to 10_3 included in the semiconductor wafers 100_1 to 100_3, respectively, without covering the region from the first boundary B1 to the first side S1. That is, the photosensitive adhesive 110 does not cover the region Rbp of the bonding pads BP and covers the front surface of each of the semiconductor chips 10_1 to 10_3 except for the region Rbp. Therefore, it is possible to stack the semiconductor wafers 100_1 to 100_3, which have been subjected to laser dicing, in a wafer state while they are shifted from each other by the region Rbp of the bonding pads BP, and to then cleave the semiconductor wafers 100_1 to 100_3. The photosensitive adhesive 110 does not almost come into contact with a reverse surface of another semiconductor chip 10 located above the bonding pads BP. Therefore, it is possible to easily cleave the semiconductor wafers 100_1 to 100_n and to easily separate mutually adjacent stacked bodies 11 from each other.

Second Embodiment

Figure 12:
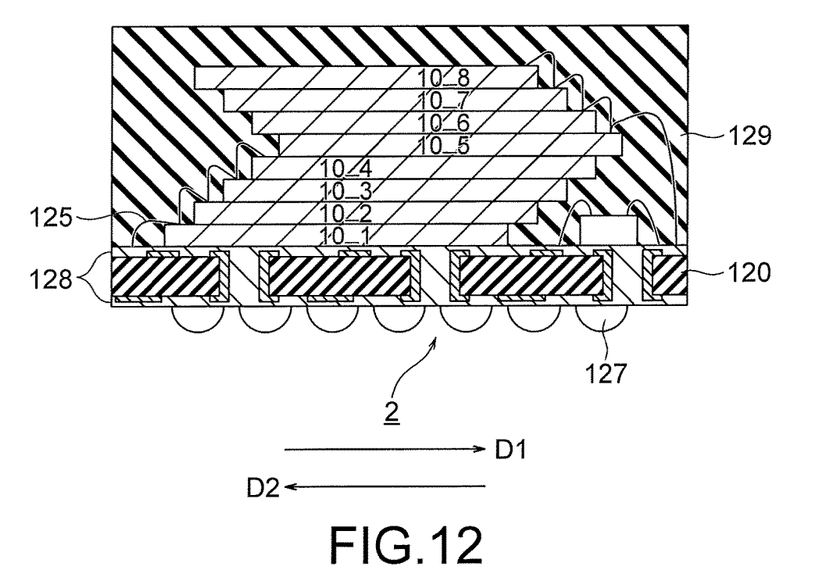
FIG. 12 is a cross-sectional view illustrating a configuration example of a semiconductor device according to a second embodiment.

FIG. 12 is a cross-sectional view illustrating a configuration example of a semiconductor device 2 according to a second embodiment. In the second embodiment, first to k-th semiconductor chips ($3 \leq k \leq n-1$) are stacked to be shifted in the first direction D1. Further, (k+1)-th to n-th semiconductor chips are stacked to be shifted in a second direction D2 opposite to the first direction D1. The first to n-th semiconductor chips may respectively have substantially same configurations. It is assumed here that n is an integer equal to or more than 2. In a case where n is 2, the second semiconductor chip is stacked to be shifted with respect to the first semiconductor chip in the first direction D1. In a case where n is 3, the second semiconductor chip is stacked to be shifted with respect to the first semiconductor chip in the first direction D1, and the third semiconductor chip is stacked to be shifted with respect to the second semiconductor chip in the second direction D2.

For example, the first to fourth semiconductor chips 10_1 to 10_4 are stacked to be shifted in the first direction D1 in FIG. 12. The shifting width of each of the first to fourth semiconductor chips 10_1 to 10_4 can be substantially equal to the shifting width of the second semiconductor chip 10_2 with respect to the first semiconductor chip 10_1 of the first embodiment. That is, the shifting width of each of the first to fourth semiconductor chips 10_1 to 10_4 is substantially equal to the width of the region Rbp of the bonding pads BP in the first direction D1. The first to fourth semiconductor chips 10_1 to 10_4 are semiconductor chips having substantially the same configurations. Meanwhile, the fifth to eighth semiconductor chips 10_5 to 10_8 are stacked to be shifted in the second direction D2. The shifting width of each of the fifth to eighth semiconductor chips 10_5 to 10_8 can be also substantially equal to the shifting width of the second semiconductor chip 10_2 with respect to the first semiconductor chip 10_1 of the first embodiment. The fifth to eight semiconductor chips 10_5 to 10_8 are semiconductor chips having substantially the same configurations. In this manner, a plurality of semiconductor chips can be stacked to be first shifted in the first direction D1 and be then shifted in the opposite direction D2 from a halfway portion.

Figure 13:
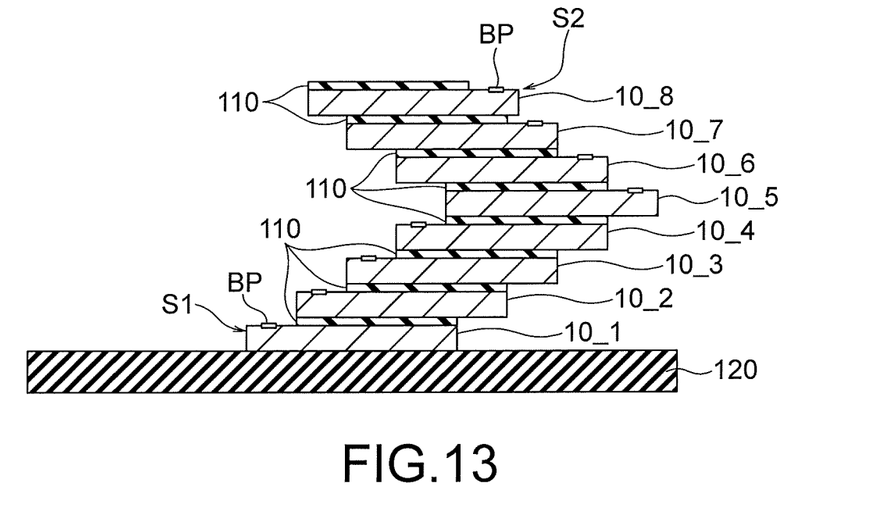
FIG. 13 is a cross-sectional view illustrating a configuration example of the stacked body according to the second embodiment.

FIG. 13 is a cross-sectional view illustrating a configuration example of the stacked body 11 according to the second embodiment. The bonding pads BP of each of the first to fourth semiconductor chips 10_1 to 10_4 are provided near the first side S1 and are arranged along the first side S1. Meanwhile, because the fifth to eighth semiconductor chips 10_5 to 10_8 are shifted in the opposite direction to that of the first to fourth semiconductor chips 10_1 to 10_4, the bonding pads BP of each of the fifth to eighth semiconductor chips 10_5 to 10_8 are provided near the second side S2 and are arranged along the second side S2. Therefore, it is possible to connect the bonding wires 125 to all the bonding pads BP of the first to eighth semiconductor chips 10_1 to 10_8.

The photosensitive adhesive 110 is provided between adjacent ones of the first to eighth semiconductor chips 10_1 to 10_8, without being provided on the bonding pads BP of each of the first to eighth semiconductor chips. That is, as the photosensitive adhesive 110 (first adhesive) between the first semiconductor chip 10_1 and the second semiconductor chip 10_2, the photosensitive adhesive 110 (second adhesive) is also provided between adjacent ones of the second to eighth semiconductor chips 10_2 to 10_8. The photosensitive adhesive 110 on each of the second to eighth semiconductor chips 10_2 to 10_8 does not cover the region Rbp of the bonding pads BP and covers the front surface of the corresponding one of the semiconductor chips 10_2 to 10_8 except for the region Rbp, as the photosensitive adhesive 110 on the first semiconductor chip 10_1.

Other configurations of the second embodiment can be identical to the corresponding configurations of the first embodiment. As described above, even if the first to eighth semiconductor chips 10_1 to 10_8 are stacked to be shifted in the opposite direction from a halfway portion, it is possible to obtain effects identical to those obtained in the first embodiment.

A manufacturing method of the semiconductor device 2 according to the second embodiment is described. First, four semiconductor wafers (not illustrated) respectively including the first to fourth semiconductor chips 10_1 to 10_4 are stacked to be shifted in the first direction D1. Subsequently, the stacked semiconductor wafers are cleaved as described above, so that the first to fourth semiconductor chips 10_1 to 10_4 are cut as a single stacked body.

Meanwhile, four semiconductor wafers (not illustrated) respectively including the fifth to eighth semiconductor chips 10_5 to 10_8 are stacked to be shifted in the second direction D2. The stacked semiconductor wafers are then cleaved as described above, so that the fifth to eighth semiconductor chips 10_5 to 10_8 are cut as a single stacked body.

Subsequently, the stacked body of the first to fourth semiconductor chips 10_1 to 10_4 is placed on the mounting board 120. Thereafter, the stacked body of the fifth to eighth semiconductor chips 10_5 to 10_8 is placed on the stacked body of the first to fourth semiconductor chips 10_1 to 10_4.

In this manner, in the second embodiment, the first to fourth semiconductor chips 10_1 to 10_4 are cut as a single stacked body, and the fifth to eighth semiconductor chips 10_5 to 10_8 are cut as a stacked body different from the stacked body of the first to fourth semiconductor chips 10_1 to 10_4. It suffices that the stacked body of the first to fourth semiconductor chips 10_1 to 10_4 is placed on the mounting board 120 and thereafter the stacked body of the fifth to eighth semiconductor chips 10_5 to 10_8 is placed on the stacked body of the first to fourth semiconductor chips 10_1 to 10_4. In this manner, a stacked body of the first to eighth semiconductor chips 10_1 to 10_8 can be formed on the mounting board 120.

Other manufacturing processes in the second embodiment can be identical to the corresponding manufacturing processes in the first embodiment. Accordingly, the manufacturing method according to the second embodiment can achieve effects identical to those achieved in the first embodiment.

In FIGS. 12 and 13, a state in which the first to eighth semiconductor chips 10_1 to 10_8 are stacked is illustrated. However, the number of the stacked semiconductor chips is not limited to eight. Therefore, the semiconductor chips 10_1 to 10_n (n is an integer equal to or more than 2) can be stacked.

Further, the shifting direction can be changed at any semiconductor chip 10_k (2≤k≤n−1) of the semiconductor chips 10_1 to 10_n. That is, it is possible that the semiconductor chips 10_1 to 10_k are stacked to be shifted in the first direction D1 and the semiconductor chips 10_k+1 to 10_n are stacked to be shifted in the second direction D2.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A manufacturing method of a semiconductor device, the method comprising:
    forming a modified layer with distortion in semiconductor crystals in a first and a second semiconductor wafers by radiating laser to a dicing region of the first and second semiconductor wafers, each of the first and second semiconductor wafers including a plurality of semiconductor chips;
    stacking the second semiconductor wafer on the first semiconductor wafer to be shifted in a first direction, the first direction being a direction from a first side of a first semiconductor chip of the first semiconductor wafer towards an opposite side to the first side of the first semiconductor chip; and
    cleaving the first and second semiconductor wafers after stacking the second semiconductor wafer on the first semiconductor wafer.

2. The method of claim 1, further comprising
    forming a first adhesive on front surfaces of the first semiconductor chip included in the first semiconductor wafer to cover a region from the opposite side to the first side of the first semiconductor chip to a first boundary in front of bonding pads provided on the first semiconductor chip and not to cover a region from the first boundary to the first side of the first semiconductor chip, wherein
    the second semiconductor wafer is stacked on the first semiconductor wafer such that a side of a second semiconductor chip of the second semiconductor wafer is shifted from the first side of the first semiconductor chip of the first semiconductor wafer to the first boundary of the first semiconductor chip.

3. The method of claim 1, further comprising:
    stacking third to n-th semiconductor wafers (n is an integer equal to or more than 3) having substantially same configurations as the first and second semiconductor wafers on the second semiconductor wafer; and
    cleaving the stacked first to n-th semiconductor wafers, wherein
    the second to n-th semiconductor wafers are stacked to be shifted in the first direction with respect to corresponding semiconductor wafers directly below, respectively.

4. The method of claim 2, further comprising:
    stacking third to n-th semiconductor wafers (n is an integer equal to or more than 3) having substantially same configurations as the first and second semiconductor wafers on the second semiconductor wafer; and
    cleaving the stacked first to n-th semiconductor wafers, wherein
    the second to n-th semiconductor wafers are stacked to be shifted in the first direction with respect to corresponding semiconductor wafers directly below, respectively.

5. The method of claim 2, wherein
the first adhesive is a photosensitive adhesive, and
in the forming the first adhesive, the first adhesive is provided on the first semiconductor wafer and is thereafter processed by a lithography technology to cover the region from the opposite side to the first side of the first semiconductor chip to the first boundary in front of the bonding pads provided on the first semiconductor chip and not to cover the region from the first boundary to the first side of the first semiconductor chip.

6. The method of claim 3, wherein
the first adhesive is a photosensitive adhesive, and
in the forming the first adhesive, the first adhesive is provided on the first semiconductor wafer and is thereafter processed by a lithography technology to cover the region from the opposite side to the first side of the first semiconductor chip to the first boundary in front of the bonding pads provided on the first semiconductor chip and not to cover the region from the first boundary to the first side of the first semiconductor chip.

7. The method of claim 1, wherein the stacking includes:
pressing the first and second semiconductor wafers by a first pressure; and
pressing the first and second semiconductor wafers by a second pressure higher than the first pressure, after pressing by the first pressure.

8. The method of claim 2, wherein the stacking includes:
pressing the first and second semiconductor wafers by a first pressure; and
pressing the first and second semiconductor wafers by a second pressure higher than the first pressure, after pressing by the first pressure.

9. The method of claim 3, wherein
the stacking includes:
pressing the first and second semiconductor wafers by a first pressure; and
pressing the first and second semiconductor wafers by a second pressure higher than the first pressure, after pressing by the first pressure.

10. The method of claim 1, wherein the semiconductor chips of the first and second semiconductor wafers respectively have substantially same configurations.

11. The method of claim 1, further comprising:
after cleaving the first and second semiconductor wafers,
mounting stacked semiconductor chips on a mounting board;
bonding a plurality of bonding pads provided on the semiconductor chips to the mounting board with wires; and
covering the semiconductor chips and the wires with a resin.

* * * * *